(12) United States Patent
Moto et al.

(10) Patent No.: US 8,405,461 B2
(45) Date of Patent: Mar. 26, 2013

(54) LIGHT RECEIVING CIRCUIT WITH DIFFERENTIAL OUTPUT

(75) Inventors: Akihiro Moto, Yokohama (JP); Keiji Tanaka, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 93 days.

(21) Appl. No.: 13/075,474

(22) Filed: Mar. 30, 2011

(65) Prior Publication Data
US 2012/0249241 A1 Oct. 4, 2012

(51) Int. Cl.
*H03F 3/08* (2006.01)
(52) U.S. Cl. .......................................... 330/308; 330/69
(58) Field of Classification Search .................. 330/308, 330/69, 252, 98, 150
See application file for complete search history.

(56) References Cited

U.S. PATENT DOCUMENTS

| | | | |
|---|---|---|---|
| 6,803,825 B2* | 10/2004 | Chiou et al. | 330/308 |
| 7,755,434 B2* | 7/2010 | Hara et al. | 330/308 |
| 7,868,701 B2 | 1/2011 | Nakamura et al. | |
| 2005/0052246 A1* | 3/2005 | Visocchi | 330/308 |
| 2006/0001493 A1* | 1/2006 | Harms et al. | 330/308 |
| 2007/0096013 A1* | 5/2007 | Sugimoto | 250/214 A |

* cited by examiner

*Primary Examiner* — Henry Choe
(74) *Attorney, Agent, or Firm* — Smith, Gambrell & Russell, LLP (57) ABSTRACT

A trans-impedance amplifier (TIA) for a light-receiving circuit is disclosed where the TIA reduces the power consumption as suppressing the degradation of the signal quality in high frequency regions. The TIA comprises a primary core, a dummy core, and a differential amplifier that receives each output of two cores in the differential mode. Two cores have an arrangement substantially same to each other except that the power consumption thereof is smaller in the dummy core. Because the output impedance of two cores becomes substantially equal, the scattering parameter of the common mode to the differential mode at the output of the primary core becomes small enough.

10 Claims, 6 Drawing Sheets

LIGHT RECEIVING CIRCUIT WITH DIFFERENTIAL OUTPUT

BACKGROUND OF THE INVENTION

1. Field of the Invention

The present invention relates to a trans-impedance amplifier (hereafter denoted as TIA), in particular, the invention relates to a TIA for converting an optical signal into an electrical signal.

2. Related Prior Arts

The United States Patent, U.S. Pat. No. 7,868,701, has disclosed a TIA for the optical communication system, in which the TIA includes two TIA core circuits and an output buffer. The first TIA core circuit converts a photocurrent into a voltage signal. The output buffer provides an input to receive the output of the first TIA core circuit. The second TIA core circuit, which has a configuration same as those of the first TIA core circuit, is coupled with a reference terminal of the output buffer.

SUMMARY OF THE INVENTION

One aspect of the present invention relates to a TIA that receives a photocurrent generated in a photodiode and outputs a differential electrical signal corresponding to the photocurrent. The TIA comprises a primary core, a dummy core, and a differential amplifier. The primary core converts the photocurrent into a voltage signal. The dummy, which has an arrangement substantially same with those of the primary core, generates a reference voltage. The differential amplifier, which receives the voltage signal from the primary core and the reference voltage from the dummy core in the differential mode, outputs a differential signal between to voltage signals. A feature of the TIA according to the present invention, the dummy core has the output impedance substantially equal to the output impedance of the primary core in a high frequency region but greater the output impedance of the primary core in a low frequency region.

The primary and dummy cores may provide an output stage including a transistor with an emitter grounded arrangement and a load element connected to the collector of the transistor for providing an output of respective cores. In the present invention, the output impedance of the load element of the dummy core may become substantially equal to the output impedance of the load element of the primary core in the high frequency region but greater than the output impedance of the primary core at the low frequency region. The load element of the dummy core may include a series circuit of a first resistor and a circuit element of a second resistor and a capacitor connected in parallel to the second resistor. The first resistor may have resistance substantially equal to the impedance of the load element of the primary core and the second resistor may have resistance which is r−1 times greater than the impedance of the load element of the primary core. The capacitor may have capacitance able to be regarded as a short circuit in the high frequency region and to be regarded as an open circuit in the low frequency region. The emitter resistor of the dummy core may have resistance which is r times greater than the resistance of the emitter resistor of the primary circuit.

BRIEF DESCRIPTION OF DRAWINGS

Non-limiting and non-exhaustive embodiments of the present invention will be described with reference to the following figures, wherein like reference numerals refer to like parts throughout the various figures unless otherwise specified.

DETAILED DESCRIPTION OF PREFERRED EMBODIMENTS

Next, some preferred embodiments according to the present invention will be described as referring to accompanying drawings. In the description of the drawings, the same numerals or symbols will refer to the same elements without overlapping explanations.

Figure 1:
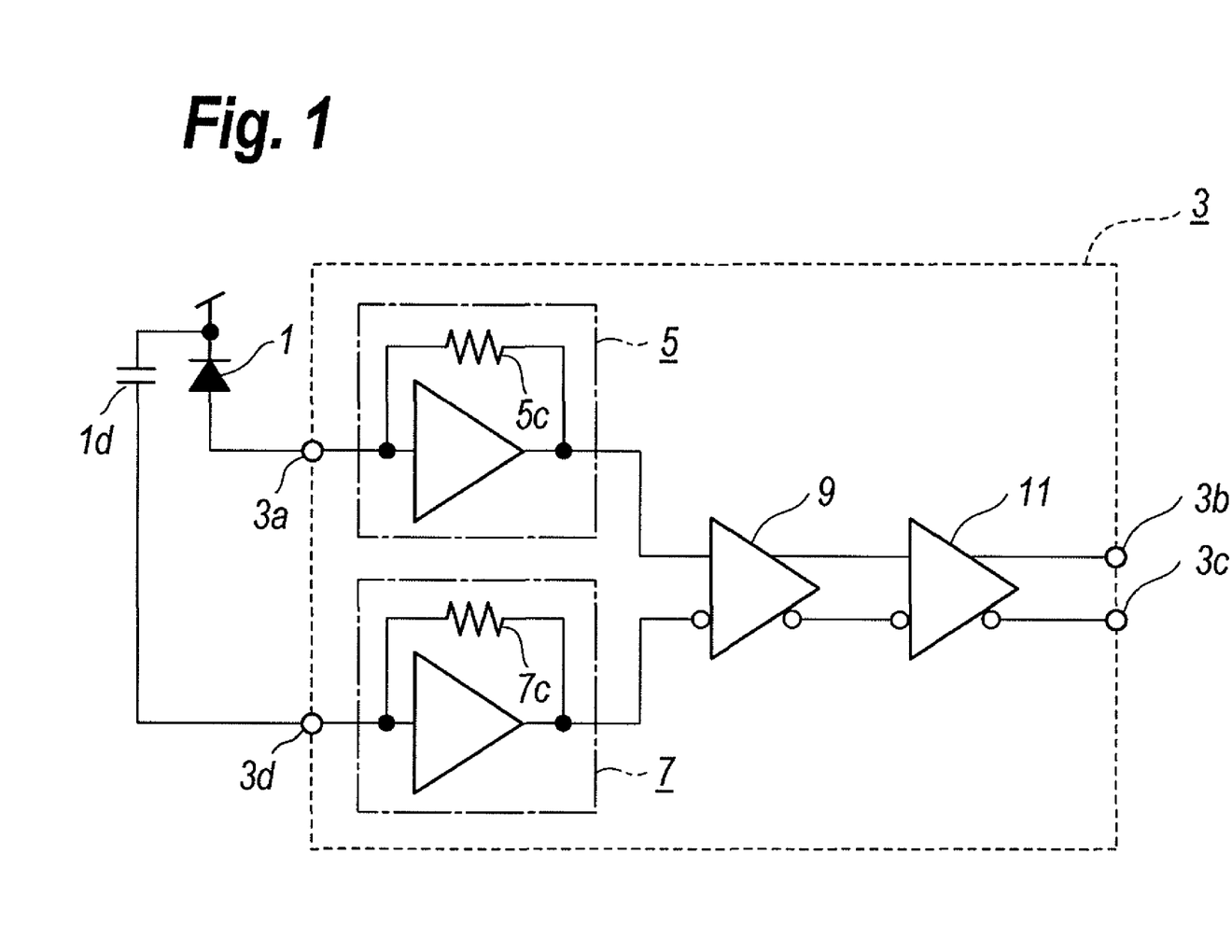
FIG. 1 is a block diagram of a TIA according to an embodiment of the present invention.

FIG. 1 is a block diagram of a trans-impedance amplifier (hereafter denoted as TIA) 3 of the present embodiment. The TIA 3, which includes a primary core 5, a dummy core 7, a differential amplifier 9 and an output buffer 11, may receive a photocurrent with frequency components over 10 GHz from the photodiode (hereafter denoted as PD) 1. The photocurrent output from the anode of the PD 1 may be input in the input terminal 3a, and led to the primary core 5. The primary core 5, which is set between the input 3a and the differential amplifier 9, may convert the photocurrent into a voltage signal to be processed by the differential amplifier 9. The dummy core 7, which is coupled with the differential amplifier in another input thereof different from that coupled with the primary core 5, may output a reference to the differential amplifier 9. The differential amplifier 9 may amplify a difference between the voltage signal coming from the primary core 5 and the reference from the dummy core 7, and may output the difference between them to the output buffer 11. The output buffer 11 may output the difference coming from the differential amplifier 9 to the outside with a designed magnitude. The output buffer 11 may show adequate output impedance.

Figure 2:
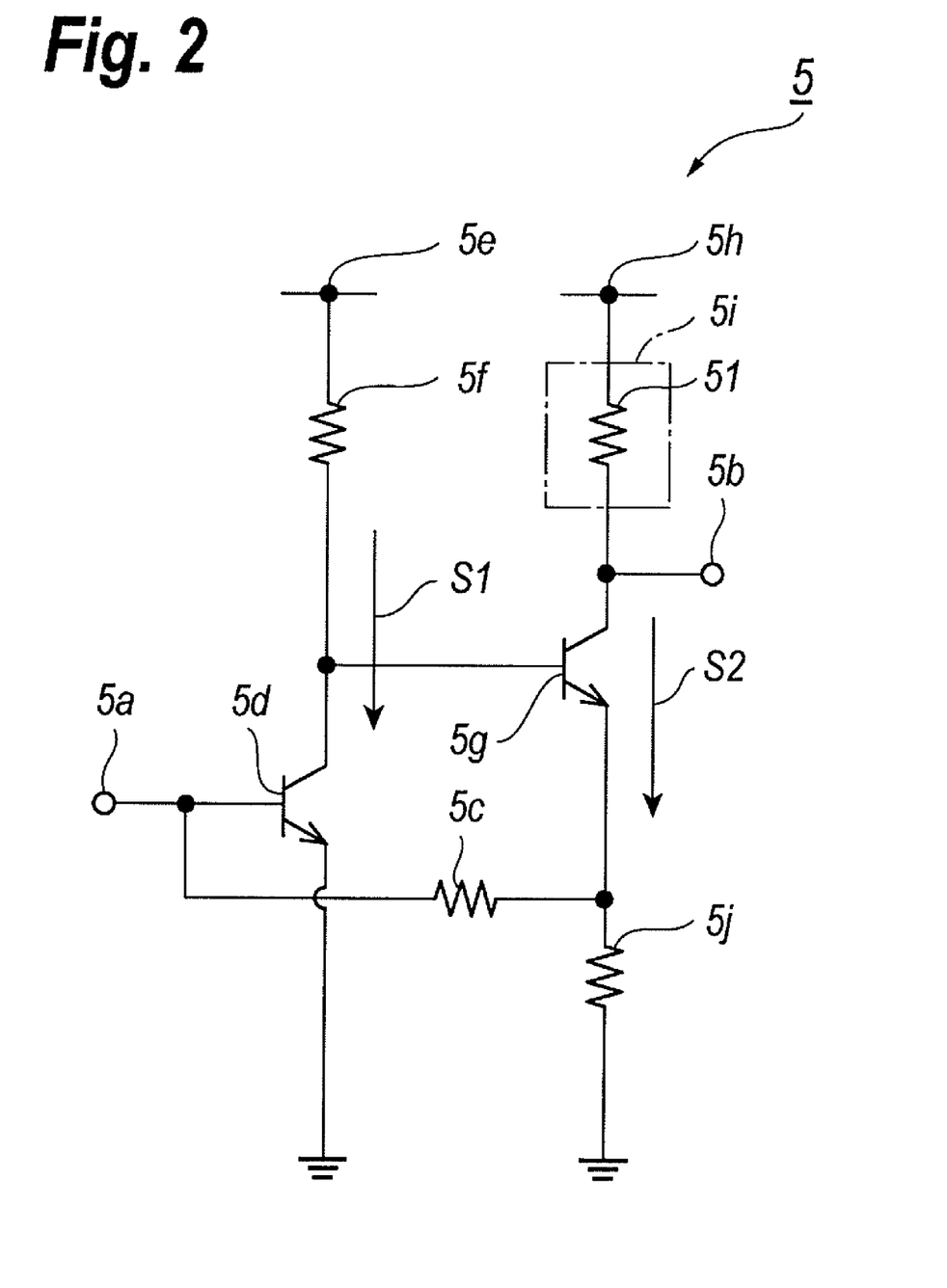
FIG. 2 is a circuit diagram of a primary core shown in FIG. 1.

FIG. 2 is a circuit diagram of the primary core 5 in an exemplary configuration thereof. The primary core 5 provides an input terminal 5a, an output terminal 5b, an impedance element 5c, a first transistor 5d, a load resistor 5f, a second transistor 5g, a load element 5i, an emitter resistor 5j and two power supplies, 5e and 5h. Two transistors, 5d and 5g, are the npn-type bipolar transistor. The base of the first transistor 5d, which is called as the control terminal, is connected to the input terminal 5a and the impedance element 5c, the collector thereof, which is called as the current terminal, is connected to the load resistor 5f and the base of the second transistor 5g, and the emitter is grounded. The first transistor 5d is powered from the power supply 5e through the load resistor 5f, thus the current flows from the power supply 5e to the ground along the arrow S1 in FIG. 2.

The second transistor 5g directly receives in the base thereof the output of the first transistor 5d. The collector of the second transistor 5g is connected with the output terminal 5b and the load element 5i, and the emitter thereof is connected to the impedance element 5c and the emitter resistor 5j. The load element 5i may include a resistor 51. The second transistor 5g is powered by the power supply 5h through the load element 5i and grounded through the emitter resistor 5j. The current flows from the power supply 5h to the ground along the arrow S2 in FIG. 2. The impedance element 5c is set between the base of the first transistor 5d and the emitter of the second transistor 5g, which operates as a trans-impedance.

The primary core 5 shown in FIG. 2 may operate, assuming the impedance of the load element 5i and that of the emitter resistor are substantially equal to the others, as a current-to-voltage converter where the input impedance Zin and the current-to-conversion ratio Zt thereof are given by:

$$Zin = R_f/(1 + gm \times R), \text{ and}$$

$$Zt \sim R_f,$$

where $R_f$, gm, and R are the resistance of the impedance element 5c, the trans-conductance of the first transistor 5g, the resistance of the load resistor 5f.

Receiving an optical signal with a level "1", which causes the PD 1 to generate the photocurrent, the photocurrent flows in the impedance element 5c and the emitter resistor 5j, which raises the base level of the first transistor 5d and increases the current flowing therein. The increased current flowing in the first transistor 5d lowers the collector level thereof, which is equal to the base input level of the second transistor 5g. Thus, the current passing through the second transistor 5g decreases, which also decreases the voltage drop across the load element 5i and raises the output level which appears in the output terminal 5b. Thus, the primary core 5 may output the voltage with the "1" level corresponding to the optical signal level "1".

On the other hand, when the PD 1 receives the optical signal with a level "0", which is the dark state, and the photocurrent generated in the PD 1 decreases, the base level of the first transistor 5d decreases because a voltage drop across the impedance element 5c and the emitter resistor 5j due to the photocurrent diminishes. Then, the current flowing in the first transistor 4d decreases and the collector level thereof increases, which increases the current flowing in the second transistor 5g and decreases the collector level thereof because a voltage drop across the load element 5i increases. Thus, the output of the primary core 5, which appears in the output terminal 5b, is set to the "0" level corresponding to the optical signal with the "0" level.

Figure 3:
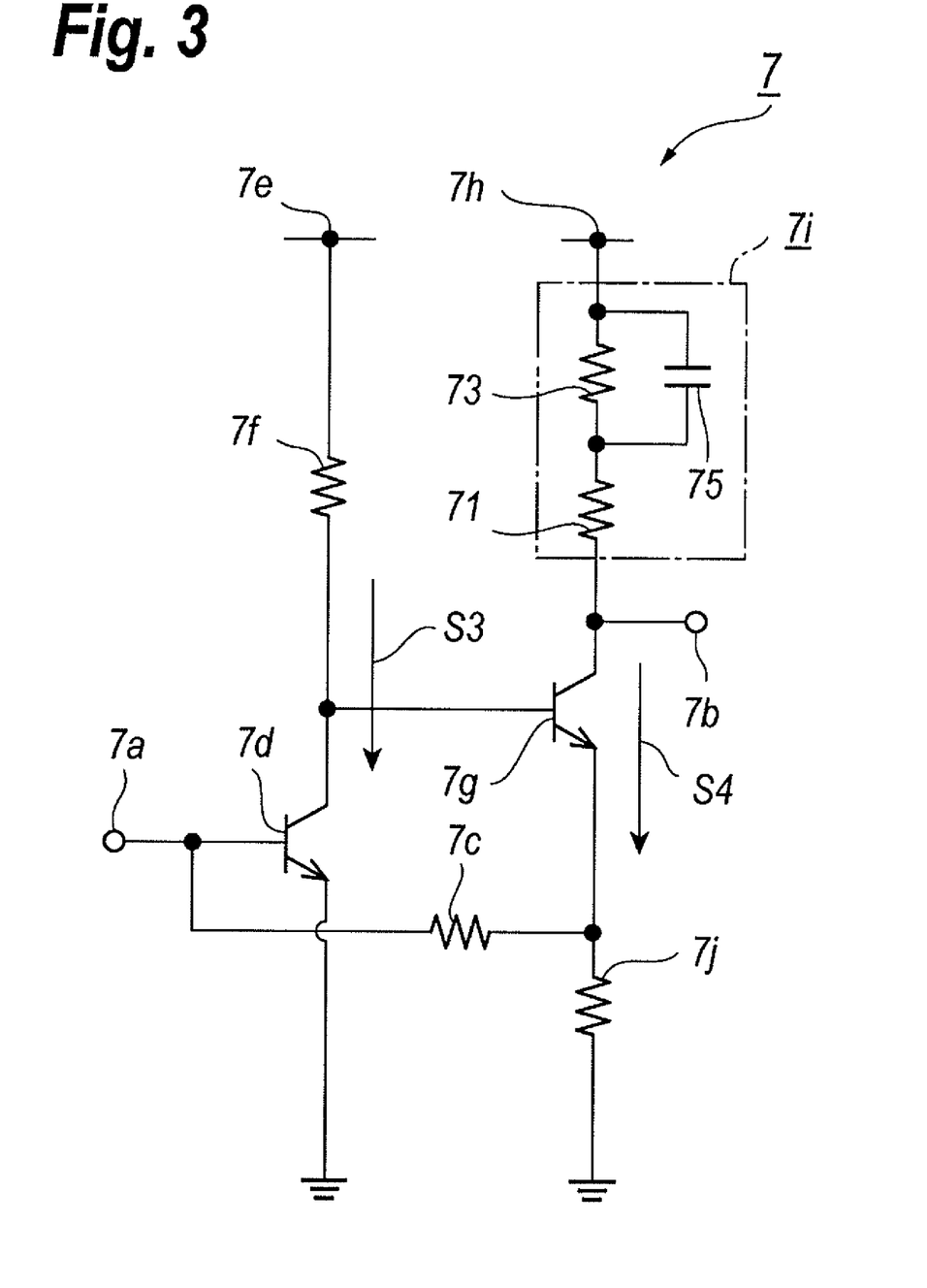
FIG. 3 is a circuit diagram of a dummy core shown in FIG. 1.

FIG. 3 is a circuit diagram of the dummy core 7 in an exemplary configuration thereof. The dummy core 7 includes an input terminal 7a, an output terminal 7b, an impedance element 7c, a third and forth transistors, 7d and 7g, a load resistor 7f, a load element 7i, an emitter resistor 7j and two power supplies, 7e and 7h. Two transistors, 7d and 7g, are the npn-type bipolar transistor. The base of the third transistor 7d is connected to the input terminal 7a and the impedance element 7c; the collector thereof is connected to the load resistor 7f and the base of the fourth transistor 7g; and the emitter is grounded. The third transistor 7d is powered from the power supply 7e through the load resistor 7f, thus the current flows from the power supply 5e to the ground along the arrow S3 in FIG. 3. The input terminal 7a is directly coupled with the other input 3d of the TIA and connected to the cathode of the PD 1 through a coupling capacitor 1d.

The fourth transistor 7g directly receives in the base thereof the output of the third transistor 7d. The collector of the third transistor 7g is connected to the output terminal 7b and the load element 7i; while the emitter thereof is connected to the impedance element 7c and the emitter resistor 7j. The fourth transistor 7g is powered by the power supply 7h through the load element 7i and grounded through the emitter resistor 7j. The current flows from the power supply 7h to the ground along the arrow S4 in FIG. 3. The impedance element 7c is set between the base of the first transistor 7d and the emitter of the second transistor 7g, which operates as the trans-impedance.

The load element 7i may include a resistor 71 and a parallel circuit of another resistor 73 and a capacitor 75. The resistor 71 is connected to the parallel circuit in series, that is, one end of the resistor 71 is connected to the collector of the fourth transistor 7g, the other thereof is commonly connected to the resistor 73 and the capacitor 75. The other end of the resistor 73 and that of the capacitor 75 are commonly connected to the power supply 7h.

The circuit elements in the primary core 5 and those in the dummy core 7 are substantially same to the others. That is, two impedance elements, 5c and 7c; two transistors, 5d and 7d; and two transistors, 5g and 7g, have a characteristic same to the other, respectively.

However, the embodiment shown in FIGS. 2 and 3 according to the present embodiment has a feature that the load resistor 7f and the emitter resistor 7j in the dummy core 7 has the resistance thereof which is r times greater than those of the load resistor 5f and the emitter resistor 5j in the primary core 5, respectively, where r is greater than unity. Moreover, the resistor 71 and the resistor 51 each has the characteristic including the resistance thereof substantially same to the other; the resistor 73 has the resistance which is r−1 times greater than that of the resistor 51; and the total resistance of two resistors, 71 and 73, is r times greater than the resistance of the resistor 51.

The output impedance of the primary core 5, which corresponds to the impedance viewed from the output terminal 5b toward the inside of the primary core 5, is given by a parallel circuit of the load element 5i with equivalent resistance of the collector of the second transistor 5g. The latter resistance, that is, the resistance of the collector, may be regarded as substantially greater that the resistance of the former because the second transistor 5g has the emitter grounded arrangement. Accordingly, the output impedance of the primary core 5 becomes substantially equal to the impedance of the load element 5i. Similarly, the output impedance of the dummy core 7 may be regarded as the impedance of the load element 7i.

However, the load element 7i shows frequency dependence; that is, in a relatively higher frequency region where the capacitor 75 may be regarded as short-circuited, the impedance of the load element 7i may be substantially equal to the resistance of the resistor 71, which is set to be equal to the resistance of the resistor 51 in the primary core 5; accordingly, the output impedance of the dummy core 7 becomes substantially equal to the output impedance of the primary core 5 in the high frequencies. While, in a relative lower frequency where the capacitor 75 may be regarded as an open-circuited, the impedance of the load element 7i is given by a series circuit of two resistors, 71 and 73, which becomes r times greater than the resistance of the load element 5i in the primary circuit 5.

Figure 4:
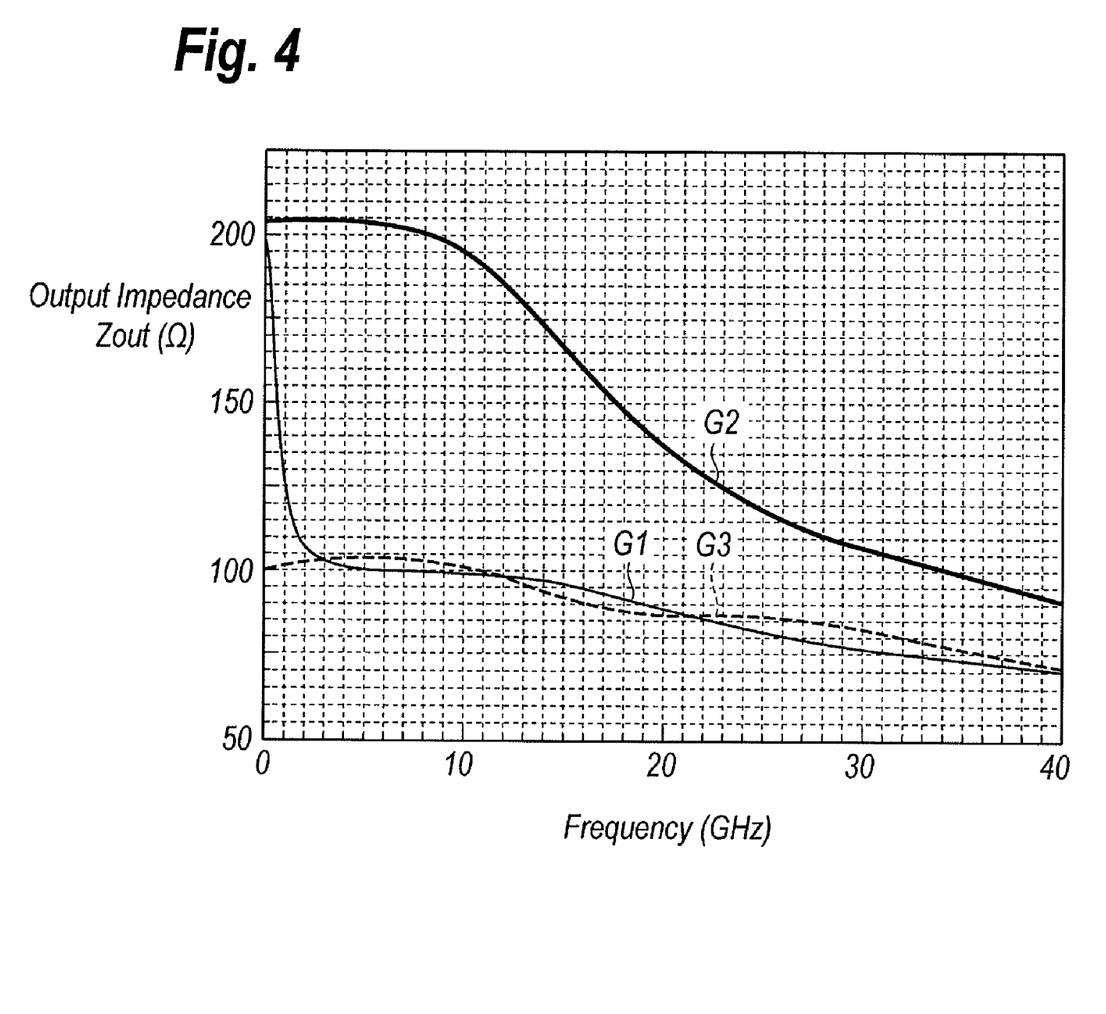
FIG. 4 compares the output impedance of the primary core with the output impedance of the dummy core.

FIG. 4 compares the output impedance of the primary core 5 with that of the dummy core 7, where the vertical axis shows the output impedance Zout and the horizontal axis corresponds to the frequency. In FIG. 4, G1 is the output impedance of the dummy core 7 with the capacitor 75, G2 is the output impedance of the dummy core 7 when the capacitor 75 is omitted, and G3 shows the output impedance of the primary core. In the analyses of FIG. 4, resistors 51, 71 and 73, are assumed to have resistance of 100Ω. FIG. 4 explicitly shows that the output impedance of the dummy core 7 becomes substantially equal to that of the primary core 5 around 10 GHz when the capacitor 75 exists, but the behavior G2 that omits the capacitor 75 shows still higher impedance even around 10 GHz.

Figure 5:
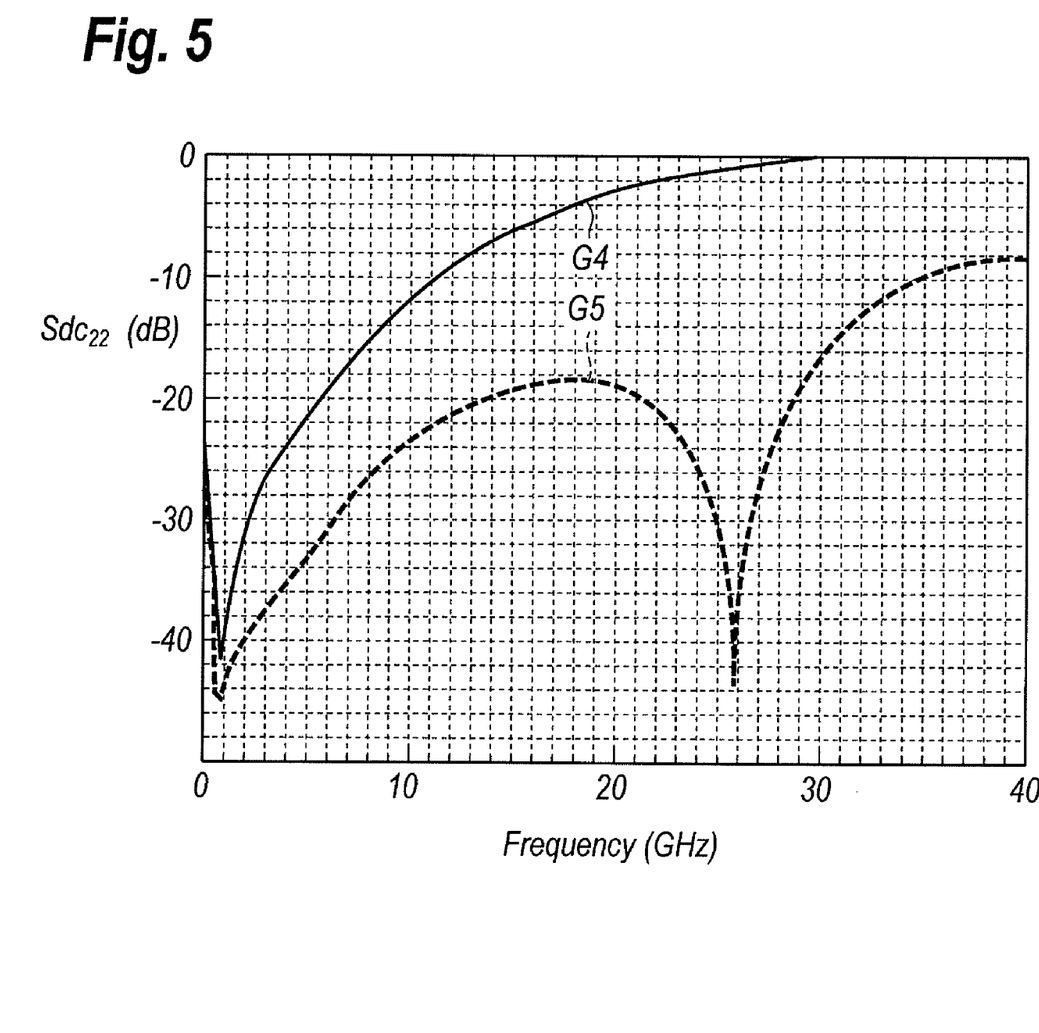
FIG. 5 shows scattering parameters for the mode conversion from the common to the differential at the output terminal of the primary core.
Figure 6:
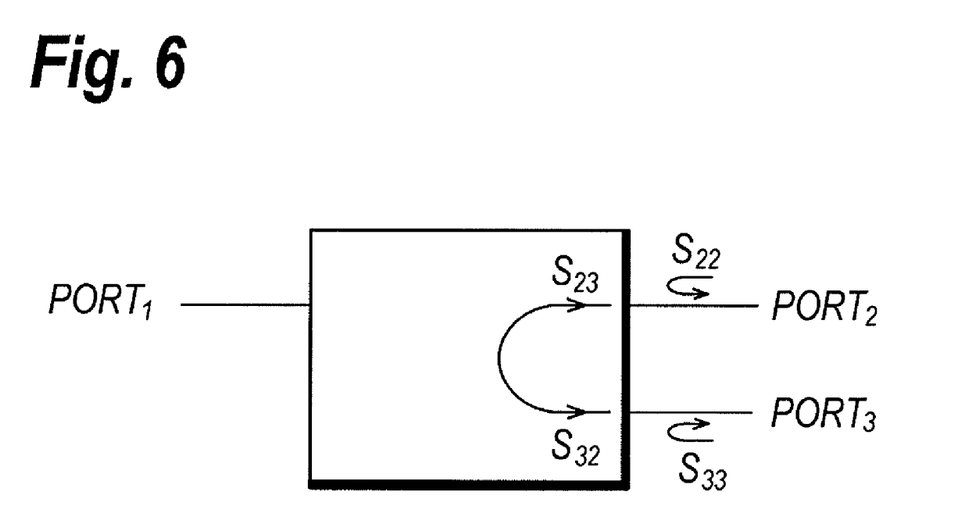
FIG. 6 explains respective scattering parameters of the outputs in the differential mode.

The mode conversion of two cores, 5 and 7, will be analyzed by using the mix-mode scattering parameters. Considering the conversion from the common mode to the differential mode between two outputs, 5b and 7b; FIG. 5 shows the differential mode output Sdc converted from portions of the common mode signal appeared in respective output terminals, 5b and 7b, which are reflected by the common mod signal appeared in the downstream of two cores, 5 and 7. The symbol Sdc means the S-parameter converted from the common mode to the differential mode, and Sdc is given by:

$$Sdc_{22}=(S_{22}+S_{23}-S_{32}-S_{33})/2,$$

where $S_{22}$, $S_{23}$, $S_{32}$, and $S_{33}$ are given by elements indicated in FIG. 6. In FIG. 5, the behavior G4 corresponds to the dummy core 7 without the capacitor 75 in the load element 7i, while, the other behavior G5 corresponds to the result with the capacitor 71.

According to FIG. 5, the former case G4 without the capacitor 75 detects a half, $(1/\sqrt{2})^2 = -3$ dB, of a common mode signal as the differential signal independent of a intrinsic signal coming from the PD 1 at the output terminal 5b around 20 GHz. While for the latter case G5 with the capacitor 75, only 1/10 (−20 dB) of the common mode signal may be detected as the differential mode signal. Thus, the dummy core 7 with the capacitor 75 in the load element 7i may improve the conversion effect from the common mode to the differential mode at the output terminal 7b. Although FIG. 5 assumes that the capacitance is 0.5 pF, another capacitor with greater capacitance may show the same or more improved result. In these analysis described above, the differential amplifier 9 and the output buffer 11 show less contribution to the mode conversion by two cores, 5 and 7, because these circuits, 9 and 11, receive signals complementary to each other and output differential signals.

The TIA 3 according to the present embodiment provides the dummy core 7 with the load element 7i that includes a resistor 71 and a parallel circuit of a resistor 73 and a capacitor, which is connected in series to the former resistor 71. In a high frequency where the capacitor 75 may be regarded as a short-circuited, the impedance of the load element 7i becomes substantially equal to that of the load element 5i in the primary core, which may improve the conversion characteristic from the common mode to the differential mode at the output terminal 5b. On the other hand in a lower frequency where the capacitor 75 may be regarded as an open-circuit, the impedance of the load element 7i becomes r times greater than that of the load element 5i in the primary core 5, which may effectively reduce the power consumption of the dummy core 7. Thus, the TIA 3 according to the present embodiment may improve the power consumption as suppressing degradation in a high frequency performance.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive

We claim:

1. A trans-impedance amplifier that receives a photocurrent generated in a photodiode and outputs a differential electrical signal corresponding to said photocurrent, comprising:
    a primary core for converting said photocurrent into a voltage signal;
    a dummy core for generating a reference, said dummy core having a substantially same arrangement as said primary core; and
    a differential amplifier for receiving said voltage signal and said reference in a differential mode,
    wherein said primary core and said dummy core each have an output stage including a transistor in an emitter-grounded arrangement, and a load element connected to a collector of said transistor, and
    wherein said load element of said dummy core has an impedance substantially equal to an impedance of said load element of said primary core in a high frequency region but greater than said impedance of said load element of said primary core in a low frequency region.

2. The trans-impedance amplifier of claim 1,
    wherein said load element of said dummy core includes a series circuit of a first resistor and a circuit element of a second resistor and a capacitor connected in parallel to said second resistor, and
    wherein said first resistor has a resistance substantially equal to said impedance of said load element of said primary core, said second resistor has a resistance r−1 times greater than said impedance of said load element of said primary core, and said capacitor has a capacitance whose impedance is far smaller than said resistance of said second resistor in said high frequency region and far greater than said resistance of said second resistor in said low frequency region.

3. The trans-impedance amplifier of claim 2,
    wherein each of said transistor in said primary core and said transistor in said dummy core are grounded through an emitter resistor, and
    wherein said emitter resistor in said dummy core has a resistance which is r times greater than a resistance of said emitter resistor in said primary core.

4. The trans-impedance amplifier of claim 1,
    wherein said dummy core has an input connected to a bias of said photodiode through a capacitor.

5. A mode conversion circuit for an optical receiver that converts a common mode signal into a pair of output signals with a differential mode, comprising:
    a photodiode whose cathode is coupled with a bias, said photodiode generating a photocurrent by receiving an optical signal;
    a primary core that receives said photocurrent and outputs a voltage signal corresponding to said photocurrent, said primary core having an output impedance;
    a dummy core that receives said bias through a capacitor and outputs a reference voltage signal, said dummy core having an output impedance; and
    a differential amplifier for receiving said voltage signal and said reference voltage signal in said differential mode,
    wherein said primary core and said dummy core have a same configuration including an input terminal, an output terminal, a first stage, a second stage and a feedback resistor, with said first stage including a first transistor and a load resistor connected to said first transistor, with said second stage including a second transistor and a load element connected to said second transistor and said output terminal, and with said second transistor being connected by its base to said collector of said first transistor and being grounded by its emitter through an emitter resistor, and wherein said load element of said dummy core has an impedance substantially equal to an impedance of said load element of said primary core in a high frequency but greater than said impedance of said load element of said primary core in a low frequency.

6. The conversion circuit of claim 5, wherein said load element of said dummy core provides a series circuit of a first resistor and a circuit element including a second resistor and a capacitor connected in parallel to said second resistor, wherein said load element of said primary core provides a third resistor, and wherein said first resistor has a resistance substantially equal to a resistance of said third resistor, and said second resistor has resistance which is r−1 times greater than said resistance of said third resistor.

7. The conversion circuit of claim 6, wherein said capacitor has a capacitance having an impedance far smaller than said resistance of said second resistor in said high frequency and far greater than said resistance of said second resistor in said low frequency.

8. The conversion circuit of claim 6, wherein said emitter resistor in said dummy core has a resistance which is r times greater than a resistance of said emitter resistor in said primary core.

9. The conversion circuit of claim 5, wherein said input of said dummy core receives said bias of said photodiode.

10. The conversion circuit of claim 5, wherein said primary core has a scattering parameter of a common mode to a differential mode at said output terminal $Sdc_{22}$ less than −10 dB for frequencies less than 20 GHz.

* * * * *